United States Patent [19]

Sachs

[11] Patent Number: 4,689,109
[45] Date of Patent: Aug. 25, 1987

[54] STRING STABILIZED RIBBON GROWTH A METHOD FOR SEEDING SAME

[76] Inventor: Emanuel M. Sachs, 39 Harding Ave., Belmont, Mass. 02178

[21] Appl. No.: 588,701

[22] Filed: Mar. 12, 1984

Related U.S. Application Data

[63] Continuation of Ser. No. 214,741, Dec. 11, 1980, abandoned.

[51] Int. Cl.[4] .............. C30G 15/24; C30G 15/34; C30G 29/60
[52] U.S. Cl. .................. 156/608; 156/617 R; 156/DIG. 65; 156/DIG. 88
[58] Field of Search ....... 156/608, DIG. 88, DIG. 65, 156/617 R; 422/246

[56] References Cited

U.S. PATENT DOCUMENTS 3,413,098 11/1968 Dermatis .................. 23/301
4,469,552 9/1984 Thornhill .................. 156/608

FOREIGN PATENT DOCUMENTS 894241 4/1962 United Kingdom .
2067920 8/1981 United Kingdom .

OTHER PUBLICATIONS

Barrett et al., J. Electrochem Soc.: Solid State Science 6/71, pp. 952-957.

*Primary Examiner*—Gary P. Straub
*Attorney, Agent, or Firm*—George W. Dishong

[57] ABSTRACT

This invention is a method of initiating or seeding the growth of a crystalline or polycrystalline ribbon by the String Stabilized Ribbon Growth Method. The method for seeding the crystal growth comprises contacting a melt surface with a seed and two strings used in edge stabilization. The wetted strings attach to the wetted seed as a result of the freezing of the liquid melt. Upon drawing the seed, which is attached to the strings, away from the melt surface a melt liquid meniscus, a seed junction, and a growth interface forms. Further pulling of the attached seed causes a crystal ribbon to grow at the growth interface. The boundaries of the growing ribbon are: at the top the seed junction, at the bottom the freezing boundary of the melt liquid meniscus, and at the edges frozen-in strings.

9 Claims, 4 Drawing Figures

STRING STABILIZED RIBBON GROWTH A METHOD FOR SEEDING SAME

FIELD OF THE INVENTION

This invention generally relates to the growth of crystalline and polycrystalline bodies from a melt by the Edge Stabilized Ribbon Growth Method or String Stabilized Ribbon Growth as described in patent application Ser. No. 439,603 now U.S. Pat. No. 4,627,887 which is a continuation of application Ser. No. 214,741 now abandoned and Ser. No. 214,741 is a continuation in part (CIP) of application Ser. No. 109,865 filed Jan. 7, 1980 now U.S. Pat. No. 4,661,200. More particularly the present invention relates to method of initiating or seeding the growth of the crystalline and polycrystalline ribbon by the String Stabilized Ribbon Growth Method.

BACKGROUND OF THE INVENTION

One of the most important applications for crystal growing is in the area of semiconductor substrate material. This substrate material is available in ribbon form in which ribbons of large-grain polycrystalline or single crystalline material are grown. The ribbons usually of silicon, have application in the semiconductor industry and are especially well adapted for use as solar cell substrates.

In U.S. patent application Ser. No. 439,603, now U.S. Pat. No. 4,627,887 a continuation of U.S. patent application Ser. No. 214,741 filed Dec. 11, 1980 now abandoned which is a continuation-in-part of U.S. patent application Ser. No. 109,865 filed Jan. 7, 1980 and which U.S. patent application Ser. No. 439,603 has been allowed on May 21, 1986, there is a detailed discussion of the prior art methods and apparatus for the fabrication of crystalline ribbon from a melt. Also included in application Ser. No. 439,603, and now U.S. Pat. No. 4,627,887 are discussions of the problems associated with the prior art methods and apparatus. These discussion are incorporated herein by reference thereto. U.S. patent application Ser. No. 591,284 entitled COMPOSITE STRINGS AND METHODS FOR MAKING SAME, filed Mar. 19, 1984 and U.S. patent application Ser. No. 695,492 entitled METHODS AND APPARATUS FOR MINORITY CARRIER DIFFUSION LENGTH MEASUREMENT, filed Jan. 28, 1985 both applications of which are pending and are drawn toward string stabilized pulling.

In String Stabilized Growth (SSG) a ribbon with an unobstructed central web is grown directly from the melt. The edge positions are determined and stabilized by wetted strings, strands or filaments running continuously through the melt and "frozen" into the growing ribbon. These strands are of a material different from the melt. In the procesds (SSG) a surface tension controlled melt liquid meniscus is defined on the bottom by the melt surface, on the top by a growth interface, and at the edges by the wetted "frozen-in" strings. The growth interface is defined by the growing crystal and the melt liquid meniscus and is existent when the crystal is being grown. A freezing boundary is also defined and is similar to the growth interface except that is exists prior to the growing of the crystal ribbon. That is the freezing boundary is that boundary comprising the upper boundary of the melt liquid meniscus which freezes onto the seed. When the crystal ribbon is being grown the growth interface and the freezing boundary are essentially the same physical location on the growing ribbon.

The invention provides for new and improved methods for seeding or initiating the growth of string stabilized ribbon grown according to the methods and apparatus disclosed in application Ser. No. 439,603, now U.S. Pat. No. 4,627,887.

SUMMARY OF THE INVENTION

The present invention is a new and improved method for initiating the growth of a crystalline or polycrystalline ribbon by the String Stabilized Ribbon Growth Method. The instant method invention comprises contacting a melt surface and two spaced apart strings, as used in edge stabilization, with a seed. The seed may or may not be of the same material as the melt. When it is of the same material as the melt the seed is wetted by the melt as a result of a contacting of the seed with the melt surface and a partial melting back of the seed material. When the seed is of a material different from the melt material, the seed is wetted by the melt as a result of a partial immersion of the seed into the melt. The melt forms a melt liquid meniscus at or on the seed lower region. The wetted seed is also contacted or brought into proximity with the upper exposed portion of the strings which extend above the melt liquid surface. As the seed is drawn away the seed attaches to the upper exposed portion of the strings due to the "freezing" of the top boundary of the melt liquid meniscus. This freezing boundary also forms the crystal growth interface and as the seed attached to the exposed strings is drawn away from the melt and melt liquid surface, the crystal ribbon growth takes place.

Objects and advantages of the invention are as set forth below.

To accomplish the seeding process requires only a minimum of operator skill and is in fact easily automated. Further, no adhesives or special mechanical fixtures or clamping are required to affix the string to the seed and commence the ribbon growth process by withdrawing the attached seed. Further, the preferred embodiment of this invention does not involve the use of materials other than the string and the material being grown. The method is inherently non-contaminating of the melt. Still further, the method of this invention includes the use of a seed of a wetted material different from the melt but which does not substantially dissolve in the melt. An example of such an alternative seed is graphite in silicon.

Other methods of the invention will in part be obvious. The invention accordingly comprises the methods which are exemplified in the following detailed disclosure of the methods of this invention. Other objects and advantages of the invention will further be obvious from a view toward the scope of the application.

DETAILED DESCRIPTION OF THE INVENTION

Figure 1:
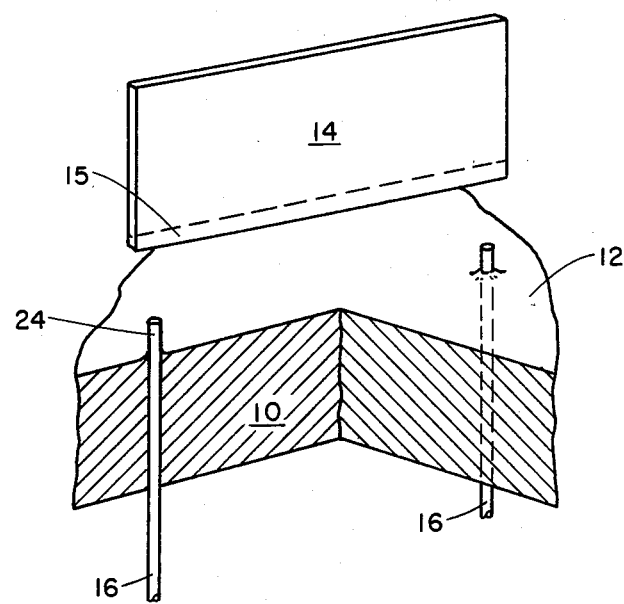
FIG. 1 illustrates the seed, melt and strings prior to the contacting of seed, melt and strings.
Figure 2:
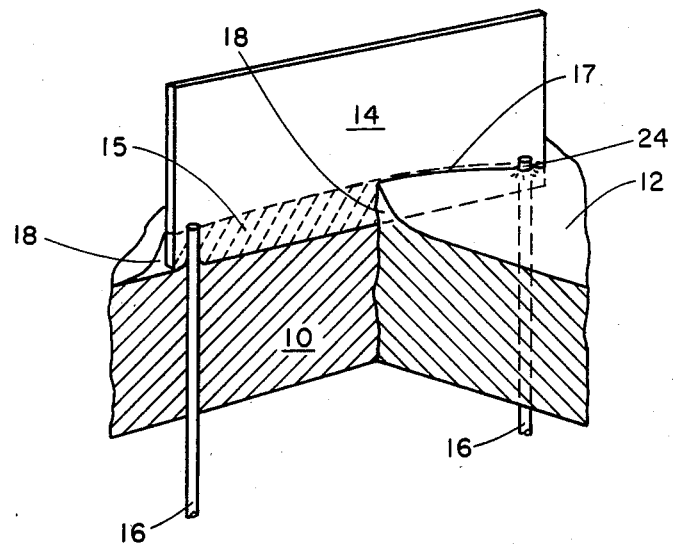
FIG. 2 illustrates the formation of melt liquid meniscus and the freezing boundary both created as a result of seed contacting.

In FIG. 1 seed 14 is positioned above the melt surface 12 and in position so that the seed lower portion 15 can be contacted with the melt surface 12 or lowered into the melt 10 and also contacted with the upper exposed portion 24 of the strings 16. With reference to FIG. 2 the seed lower portion 15 is contacted with the melt surface 12 and with exposed strings 24 creating a melt liquid meniscus 18. The melt liquid meniscus 18 having a freezing boundary 17 defined where meniscus 18 terminates on seed 14. The meniscus 18 is in contact with the seed lower region 15 and exposed strings 24.

Figure 3:
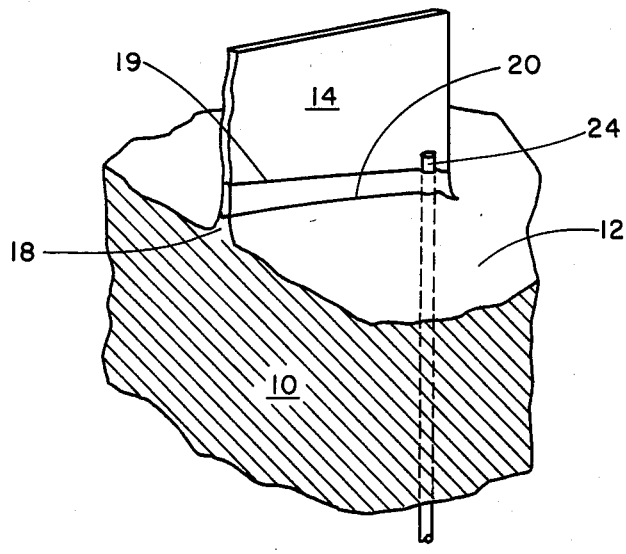
FIG. 3 illustrates the creation of a seed junction and a growth interface when seed is drawn from the melt.

FIG. 3 illustrates the formation of the seed junction 19 and the growth interface 20. The junction 19 and the interface 20 are created when the seed 14 is drawn away from the melt 10 and melt surface 12. The seed 14 is thus attached to the exposed strings 24 and to the melt liquid meniscus 18 from the seed junction 19 to the growth interface 20 and where the seed material is different from the melt 10 the seed junction 19 provides the attachment over a distance about equal to the depth the seed lower region 15 was lowered into the melt 10 plus the height of the melt liquid meniscus 18. For the case where the seed material is essentially the same as the melt material the seed junction 19 distance to the growth interface 20 is about equal to the height of the melt liquid meniscus 18.

Figure 4:
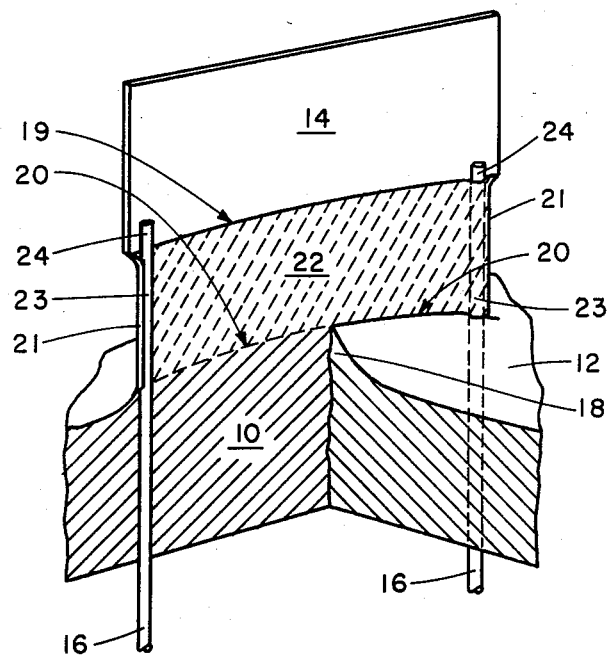
FIG. 4 illustrates the growth of the ribbon taking place at the growth interface as the seed is further drawn away from the melt.

In FIG. 4 the seed 14 has been withdrawn completely from the melt 10 and melt surface 12 and the growth interface 20 is the interface between the grown ribbon 22 and the freezing boundary 17 of the melt liquid meniscus 18. The ribbon 22 is defined above by the seed junction 19, below by the freeziing boundary 17 and along the edge 21 by the stabilizing frozen-in strings 23.

The strings 16 will extend above the melt surface 12; thus called exposed strings 24. The amount of the extension of the strings 16 above the melt surface 12 is typically about ¼ inch. The seed 14 may be of a material different from the melt 10. When the seed 14 is of the same material as the melt 10 the temperature of the melt 10 adjusted to provide for some slight melting back of the seed 14. A stable melt liquid meniscus 18 is thus formed. If the seed 14 is of a material different from that of the melt 10 the seed 14 is wetted by the melt 10. That is the seed lower region 15 is immersed through the melt surface 12 and into melt 10. When the seed 14 is so immersed the starting melt temperature is of less importance.

It should further be noted that the seed 14 may be brought into contact with the melt surface 12, moved toward exposed strings 24 or the seed 14 may be brought down directly alongside of the exposed strings 24 until melt surface 12 is contacted. Further, the width of the seed 14 should be about equal to or greater than the distance between strings 16.

Note further that as the seed 14 is drawn away from the melt 10 and the melt surface 12 and the melt liquid meniscus 18 is drawn upward toward the position assumed during ribbon growth, the melt liquid begins to freeze onto the seed 14 at the freezing boundary 17 as the seed 14 continues to move beginning the formation of the ribbon 22. As the exposed strings 24 are positioned to extend through the melt liquid meniscus 17 and subsequently through the seed junction 19 and next to the seed 14, the frozen-in strings 23 are necessarily frozen into the solidifying ribbon 22 shortly after growth of the ribbon 22 commences. Thus the strings 24 are automatically attached to the seed 14 and subsequently frozen-in strings 23 are frozen into the ribbon 22 and all accomplished without the use of a foreign substance.

If the seed 14 was significantly wider than the distance between strings 16, a meniscus will initially form outside the space defined by the frozen-in strings 23. This liquid will drop off as pulling continues leaving only the frozen-in strings 23 defining the ribbon 22. It is preferred that the exposed strings 24 be in contact with the seed 12; however, even if a small distance exists between the exposed strings 24 and the seed 14 the exposed string 24 will attach to seed 14 and frozen-in string 23 will be frozen into ribbon 22.

Although specific embodiments of the invention have been disclosed and discussed, it will be understood that other applications of the invention are possible and that the embodiments disclosed may be subject to changes, modifications and substitutions without departing from the spirit and scope of this invention and without changing the inventive concept itself, which concept is defined in the claims set forth below.

What I claim is:

1. A method for initiating a growing of a crystal in which said crystal is grown from a melt comprising the steps of contacting a seed with said melt, and with two strings protruding upward through the surface of the melt and extending slightly above the melt surface drawing said seed contact with said melt and with said extending strings away from said melt thereby initiating the growing of said crystal said strings freezing into said crystal and thereby attaching thereto and acting to define edges of said crystal.

2. The method of claim 1 wherein said seed contacted with said melt surface and said extending strings consists essentially of the same material as said melt.

3. The method of claim 1 wherein said seed is graphite in silicon.

4. The method of claim 1 wherein said strings are about parallel and two dimensionally planar.

5. The method of claim 4 wherein said two strings penetrate above said melt surface at least about one fourth of an inch (¼ inch).

6. The method of claim 1 wherein said contacting a seed with said extending strings is effected although a small distance exists between said exposed strings and said seed.

7. The method of claim 1 wherein said contacting step further comprises the steps of:
immersing said seed at most partially into said melt;
moving partially immersed seed into contact with said exposed strings.

8. The method of claim 1 wherein said seed has a width dimension at least about equal to or greater than said distance between said two strings.

9. A method for seeding a crystal grown from a body of melt having a melt surface thereon and grown at a growth interface of the growing crystal and a melt liquid meniscus having a freezing boundary thereon the crystal and the melt being the same material comprising the steps of:
providing two strings having a distance therebetween said strings protruding upward through the surface of the melt and extending slightly above the melt surface;
contacting said melt surface and said extending strings at the lower region of a seed thereby creating said melt liquid meniscus having a freezing boundary thereon;

drawing away said seed from said melt and said melt surface thereby creating a seed junction, said growth interface and said melt liquid meniscus assuming a configuration allowing for said crystal growing and for said exposed strings to attach to said seed at said freezing boundary and said exposed strings being frozen into said melt at said freezing boundary; and moving away from said melt surface said seed having said seed junction thereon and attached to said exposed strings thereby causing said ribbon to grow at said growth interface comprising said freezing boundary and said formed ribbon and wherein said formed ribbon has edge positions determined and stabilized by said two strings freezing into said formed ribbon.

* * * * *